PRINTED CIRCUIT BOARD FORMING CLOSURE FOR ELECTRICAL RELAY

Filed March 18, 1965

INVENTOR.
Bryant W. Fisher
BY Donald P. Gillette
ATTORNEY

United States Patent Office 3,339,117
Patented Aug. 29, 1967

3,339,117

PRINTED CIRCUIT BOARD FORMING CLOSURE FOR ELECTRICAL RELAY

Bryant W. Fisher, Frederick, Md., assignor to Consolidated Electronics Industries Corp., New York, N.Y., a corporation of Delaware Filed Mar. 18, 1965, Ser. No. 440,749
3 Claims. (Cl. 317—101)

ABSTRACT OF THE DISCLOSURE

This is a simple, inexpensive, hermetic enclosure for a relay mounted on one surface of a printed circuit board and having leads extending through the board and soldered to the circuit printed on the other surface of the board. The board forms part of the enclosure, the remainder of which is a can that fits over the relay. In order to attach the can to the board, a closed metal loop corresponding in shape to the perimeter of the can is printed on the same surface of the board on which the relay is mounted. The loop encircles the relay so that the can may be placed over the relay and soldered to the loop. Additional electrical components are mounted on the same surface as the relay but outside of the can.

This invention relates to means for enclosing an electrical component utilizing printed circuit techniques in forming the enclosure, and particularly to electrical apparatus including a printed circuit with the circuit board forming part of an enclosure for an electrical component.

It has long been known to be desirable to enclose certain electrical components, especially relays and other delicate electro-mechanical structures, within a chamber that is sealed at least against dust and, in many instances, against changes in the atmosphere, such as changes due to moisture or air-borne chemicals. With the constant reduction in size and weight of electronic apparatus that has taken place in recent years, the complete enclosures for certain components, such as relays, have made it impossible to reduce the size and weight of such components as much as is desired.

In the present invention, a printed circuit board serves as a closure for a can containing an electrical component. The board is provided with a pattern that matches the perimeter of the can, permitting the can to be soldered thereto either by an unbroken solder ring so as to create a hermetic enclosure or by separate soldered areas to create a dustproof cover for the component. Furthermore, the same board may be used as a printed circuit board as well as being used as a closure member.

The invention will be further described in connection with the drawings in which.

Figure 1:
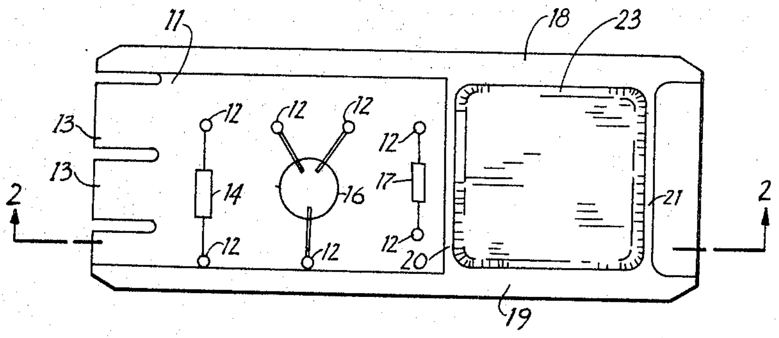
FIG. 1 is a top view of a printed circuit board and relay can, together with electrical components attached to the board.

In the apparatus in FIG. 1 a board 11 of insulating material is provided with the necessary apertures 12, together with contact areas 13 for insertion in a printed circuit receptacle of the standard type. Several electrical components including, for example, a resistor 14, a transistor 16, and a diode 17 are shown attached to the board 11 in the conventional manner by having their leads inserted into and soldered within the aperture 12.

The upper surface of the board is provided, in accordance with the invention, with a printed configuration consisting of metal strips 18 and 19 along each side of the board, joined by metal strips 20 and 21. These four metal strips overlap the edges of a can 23 which encloses another electrical component, in this case a relay.

Figure 2:
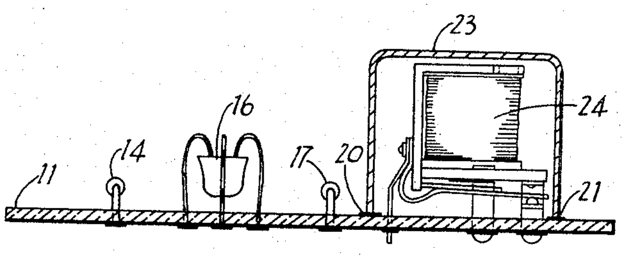
FIG. 2 is a cross-sectional view of the apparatus of FIG. 1.

The relay 24 together with other electrical components is shown in FIG. 2. As may be seen, the electrical components including the relay are all soldered to conductors on the lower surface of the board 11. Conventionally, this is done by first assembling the components, including the resistor 14, the transistor 16 and the diode 17 along with the relay 24 in their proper apertures on the board 11 and then floating the board on top of a bath of molten solder. The solder works its way into the apertures 12 and firmly joins the leads of the components to the printed metal strips of the bottom surface of the board 11.

In accordance with the present invention, the can 23 is thereafter placed over the relay 24 and its lower edges are soldered to the metal strips 18–21, of which only the strips 20 and 21 appear in FIG. 2. The soldering of the can 23 to these strips is best done by conventional hand soldering, using a soldering iron or gun rather than by means of a solder bath, since it would require the can and the electrical components to be immersed in the molten solder or else would require the board to be immersed, which might destroy the electrical components.

Figure 3:
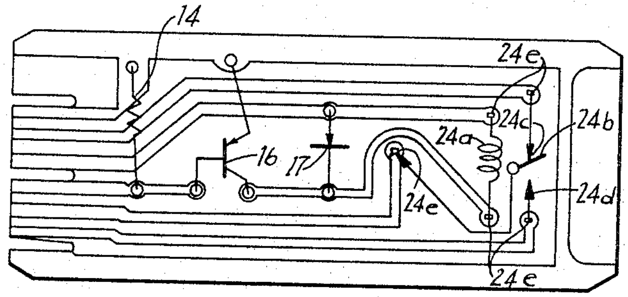
FIG. 3 is a bottom view of the apparatus of FIG. 1 with the electrical components depicted schematically.

As may be seen in FIG. 3, the printed wiring on the bottom surface of the board is suitable not only for receiving the relay 24 but also the other electrical components and for properly inter-connecting them into a relayed circuit. All of the electrical components are shown in schematic form with the relay being represented by its coil **24*a*, armature 24*b*, and contacts 24*c* and 24*d*. The terminals 24*e* of the relay are all spaced in accordance with the modular arrangement of printed circuit apparatus. While the other electrical components including the resistor 14, the transistor 16 and the diode 17 are shown schematically and are illustrated as being connected to appropriate printed circuit connections to form a circuit for operating the relay 24**, it will be understood that these inter-connections are shown only to illustrate a typical arrangement; the invention is by no means limited to this single circuit embodiment, but is appropriate to any electrical printed circuit apparatus in which electrical connections are to be made on one surface of a printed circuit board to an electrical component attached to or suspended above the other surface, which electrical component is to be enclosed within a can soldered to printed metal strips on the other surface.

While the metal can 23 is illustrated as being a parallelepiped open at one side, it may, of course, have other configurations. For example, it may be a cylinder closed at one end, but in any case the configuration of the metal strips 18–21 would have to conform to the perimeter of the open part of the can. Moreover, the can could be made of an insulating material having a metal edge suitable for soldering to the printed circuit strips on the upper surface of the board. While the word "upper" is used, it will, of course, be recognized by those skilled in the art that this is only for the sake of lending concreteness to the description. The printed circuit may be mounted in any position with the can 23 either on top, on the side, or on the bottom.

What is claimed is:

1. Electrical apparatus comprising a relay having a plurality of terminals extending in one direction; a flat insulator board having a plurality of apertures spaced to receive said terminals and having additional apertures; an electrical circuit printed on one side of said board and including portions surrounding each of said apertures; a closed metal pattern printed on the opposite side from said circuit surrounding said plurality of apertures; a plurality of electrical components on the same side of said board as said closed pattern but outside of said pattern, each of said components having connecting leads extending through said additional apertures in said board and being soldered to said circuit, said relay being located on the same side of said board as said components and said plurality of terminals extending through said plurality of apertures and being soldered to said circuit; and a relay cover over said relay, said cover having a substantially planer perimeter corresponding in size and shape to said pattern and being soldered thereto to enclose said relay.

2. The apparatus of claim 1 in which the entire perimeter of said can is soldered to said pattern.

3. The apparatus of claim 2 in which spaced portions of said can are soldered to said pattern.

References Cited

UNITED STATES PATENTS

| | | | |
|---|---|---|---|
| 3,052,822 | 9/1962 | Kilby | 317—101 |
| 3,157,828 | 11/1964 | Flaherty | 317—100 |

DARRELL L. CLAY, *Primary Examiner.*